United States Patent
Dobashi et al.

(10) Patent No.: US 11,791,131 B2
(45) Date of Patent: Oct. 17, 2023

(54) CHARGED PARTICLE BEAM APPARATUS AND METHOD FOR CONTROLLING CHARGED PARTICLE BEAM APPARATUS

(71) Applicant: Hitachi High-Tech Corporation, Tokyo (JP)

(72) Inventors: Takashi Dobashi, Tokyo (JP); Hirokazu Tamaki, Tokyo (JP); Hiromi Mise, Tokyo (JP); Shuntaro Ito, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 148 days.

(21) Appl. No.: 17/608,651

(22) PCT Filed: May 23, 2019

(86) PCT No.: PCT/JP2019/020503
§ 371 (c)(1),
(2) Date: Nov. 3, 2021

(87) PCT Pub. No.: WO2020/235091
PCT Pub. Date: Nov. 26, 2020

(65) Prior Publication Data
US 2022/0230844 A1    Jul. 21, 2022

(51) Int. Cl.
*H01J 37/28*    (2006.01)
*H01J 37/20*    (2006.01)
(Continued)

(52) U.S. Cl.
CPC ............ *H01J 37/02* (2013.01); *H01J 37/20* (2013.01); *H01J 37/222* (2013.01);
(Continued)

(58) Field of Classification Search
CPC .......... H01J 37/28; H01J 37/20; H01J 37/222; H01J 37/244; H01J 37/265;
(Continued)

(56) References Cited

U.S. PATENT DOCUMENTS 5,453,617 A    9/1995  Tsuneta et al.
9,905,394 B1 *  2/2018  Bhattiprolu ........... H01J 37/265
(Continued)

FOREIGN PATENT DOCUMENTS

| JP | 07006725 A | 1/1995 |
| WO | 2016/006375 A1 | 1/2016 |
| WO | 2018/221636 A1 | 12/2018 |

OTHER PUBLICATIONS

International Search Report, PCT/JP2019/020503, dated Aug. 6, 2019, 2 pgs.

*Primary Examiner* — David A Vanore
(74) *Attorney, Agent, or Firm* — Volpe Koenig

(57) ABSTRACT

A charged particle beam apparatus includes a movement mechanism, a particle source, an optical element, a detector, and a control mechanism configured to control, based on an observation condition, the movement mechanism, the particle source, the optical element, and the detector. The control mechanism is configured to acquire a diffraction pattern image including a plurality of Kikuchi lines as a comparison image after inclining the movement mechanism by a first angle, evaluate an error between an inclination angle of the sample and a target inclination angle using a reference image of a reference diffraction pattern and the comparison image, and control inclination of the movement mechanism based on an evaluation result.

7 Claims, 13 Drawing Sheets

(51) Int. Cl.
  *H01J 37/22*  (2006.01)
  *H01J 37/244* (2006.01)
  *H01J 37/26*  (2006.01)
  *H01J 37/02*  (2006.01)
(52) U.S. Cl.
  CPC .......... *H01J 37/244* (2013.01); *H01J 37/265* (2013.01); *H01J 2237/2802* (2013.01); *H01J 2237/2817* (2013.01)
(58) Field of Classification Search
  CPC ...... H01J 2237/2802; H01J 2237/2817; G01N 23/2055; G01N 2223/0566; G01N 2223/303; G01N 23/04; G01N 23/20058
  See application file for complete search history.

(56) References Cited

U.S. PATENT DOCUMENTS

| | | | | |
|---|---|---|---|---|
| 10,876,979 B2 * | 12/2020 | Konaka | | G01N 23/20008 |
| 10,976,270 B2 * | 4/2021 | Wormington | | G01N 23/223 |
| 2011/0174972 A1 * | 7/2011 | Duden | | H01J 37/20 |
| | | | | 250/311 |
| 2011/0284744 A1 * | 11/2011 | Zewail | | H01J 37/228 |
| | | | | 250/311 |
| 2014/0291511 A1 * | 10/2014 | Man | | H01J 37/3002 |
| | | | | 250/307 |
| 2016/0054240 A1 * | 2/2016 | Uncovský | | H01J 37/244 |
| | | | | 250/307 |
| 2017/0133195 A1 * | 5/2017 | Yaguchi | | H01J 37/20 |
| 2017/0309441 A1 * | 10/2017 | Flanagan, IV | | H01J 37/261 |
| 2017/0365441 A1 * | 12/2017 | Bedell | | G01N 23/203 |
| 2019/0035597 A1 * | 1/2019 | Krasienapibal | | H01J 37/222 |
| 2020/0013581 A1 * | 1/2020 | Vystavel | | H01J 37/2955 |
| 2020/0066481 A1 * | 2/2020 | Mori | | H01J 37/2955 |
| 2021/0296087 A1 * | 9/2021 | Doemer | | G01N 23/2055 |
| 2021/0375582 A1 * | 12/2021 | Vystavĕl | | H01J 37/244 |
| 2022/0216034 A1 * | 7/2022 | Dobashi | | H01J 37/244 |
| 2022/0230844 A1 * | 7/2022 | Dobashi | | G01N 23/2055 |
| 2022/0412900 A1 * | 12/2022 | Han | | H01J 37/28 |

* cited by examiner

[FIG. 1]
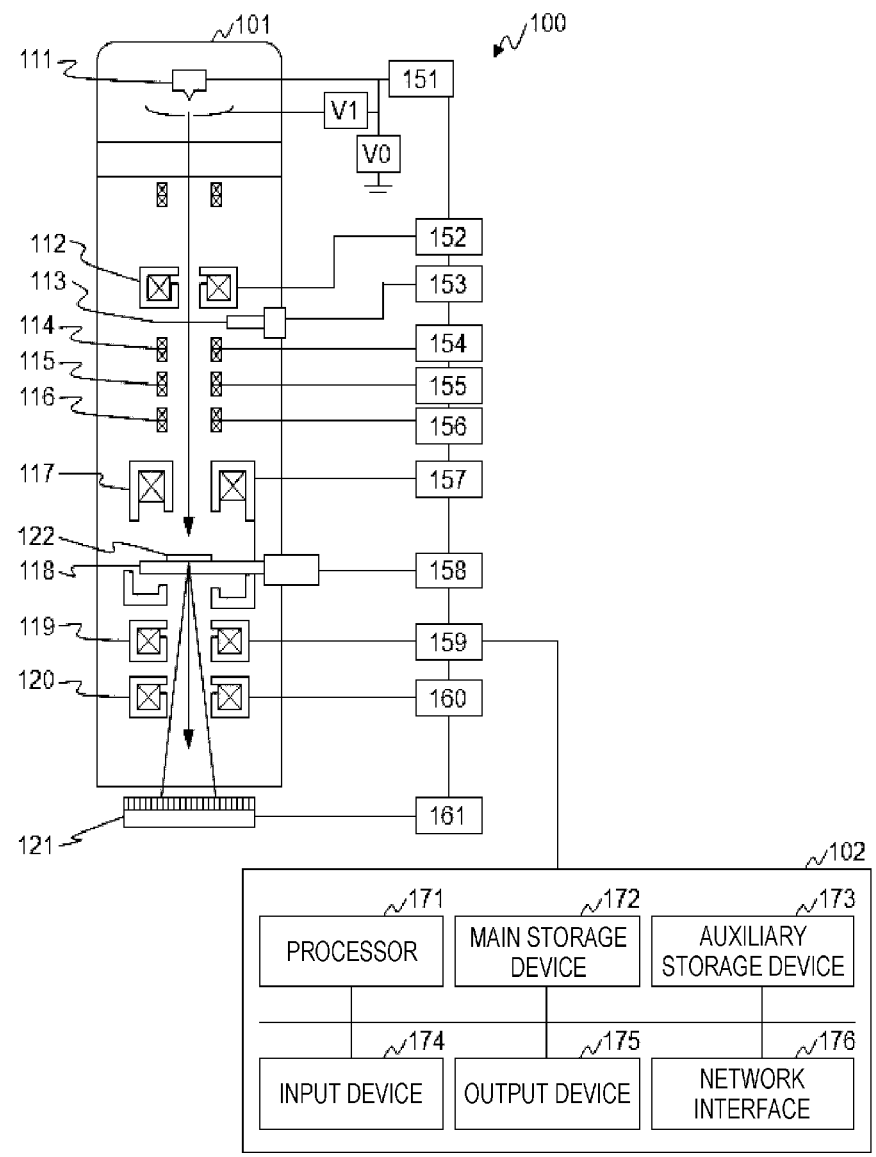

[FIG. 2]
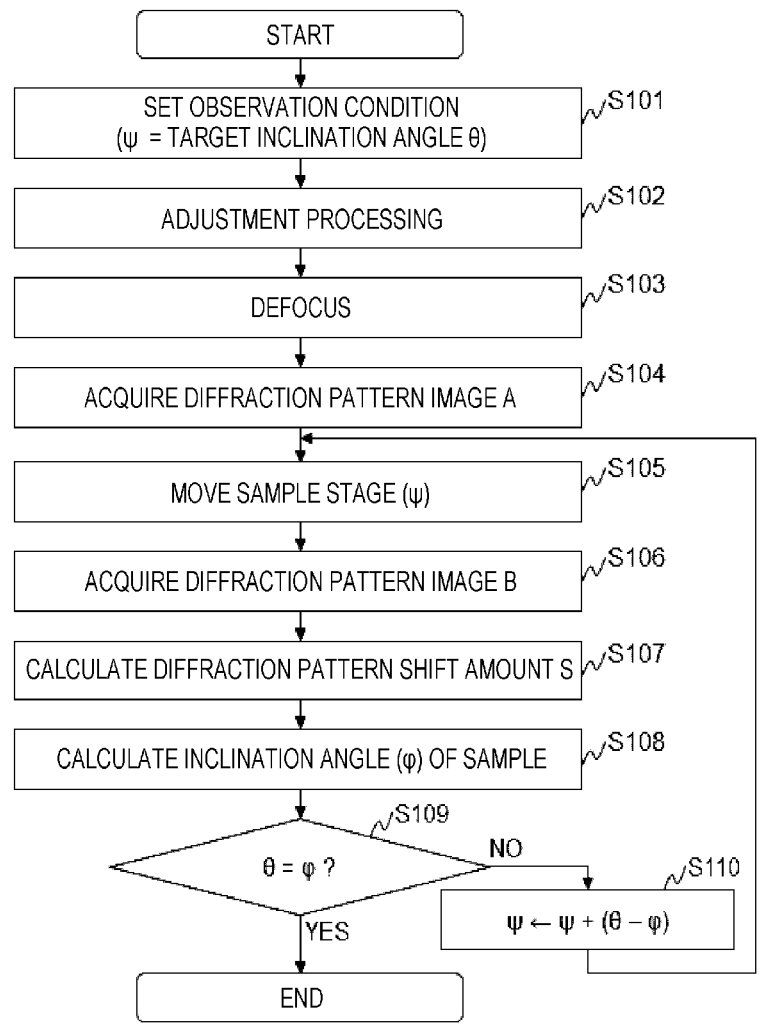

[FIG. 3A]
[FIG. 3B]
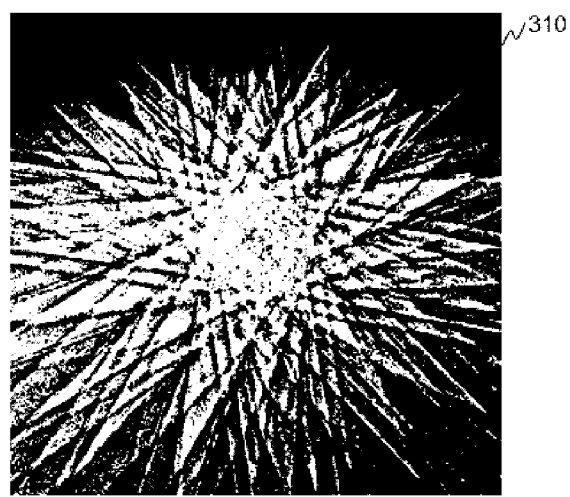

[FIG. 3C]
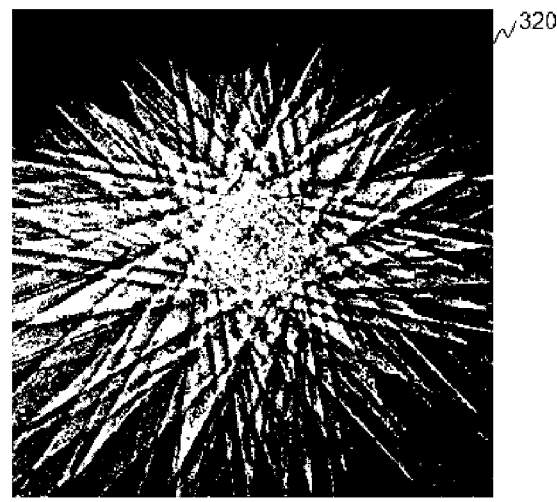
[FIG. 4]
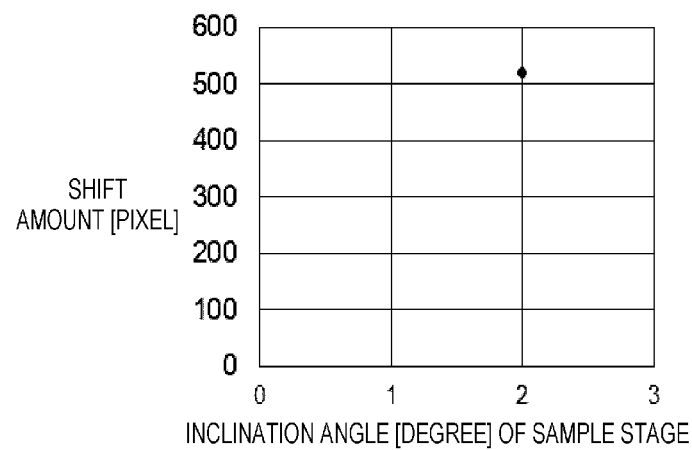

[FIG. 5]
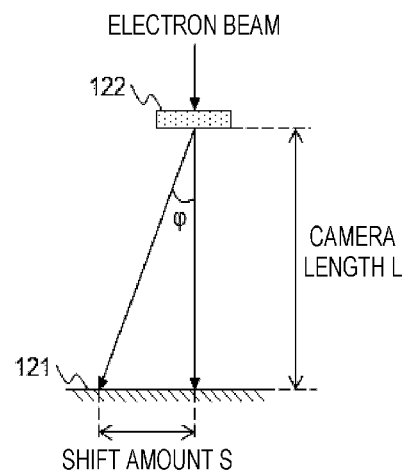
[FIG. 6A]
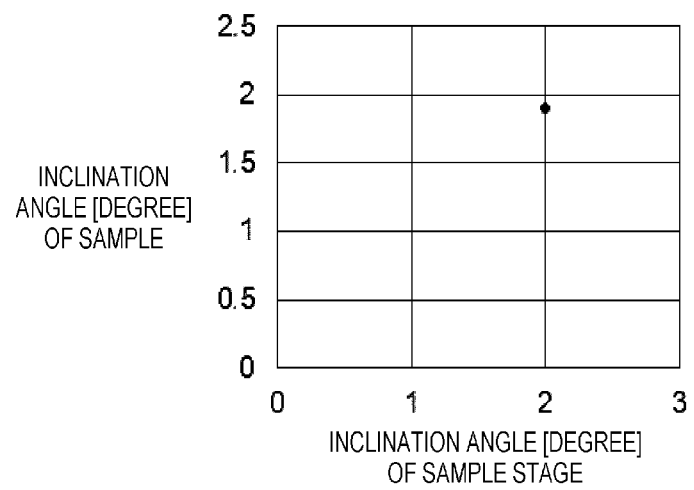

[FIG. 6B]
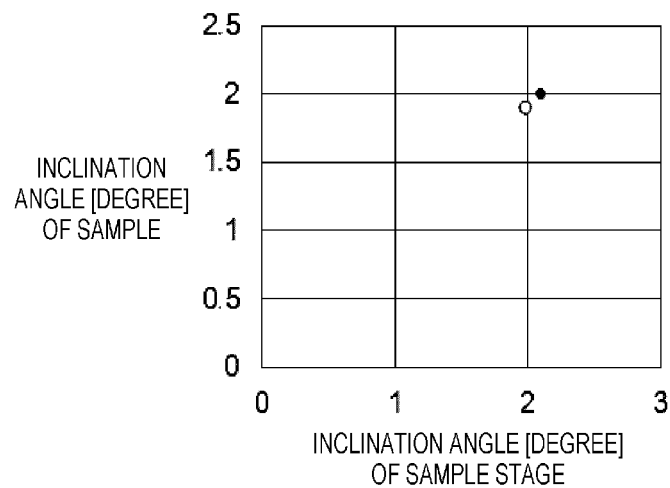
[FIG. 7]
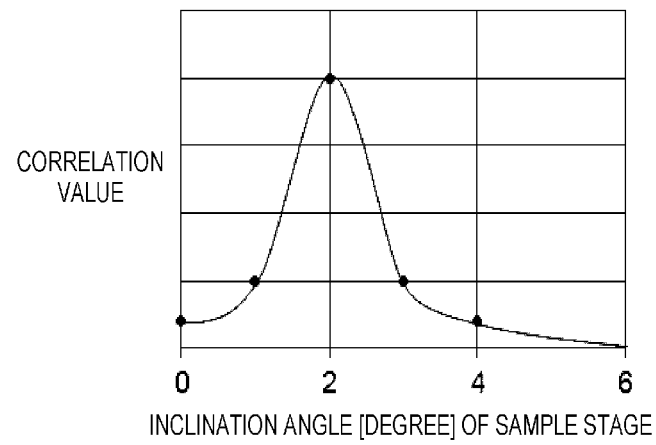

[FIG. 8]
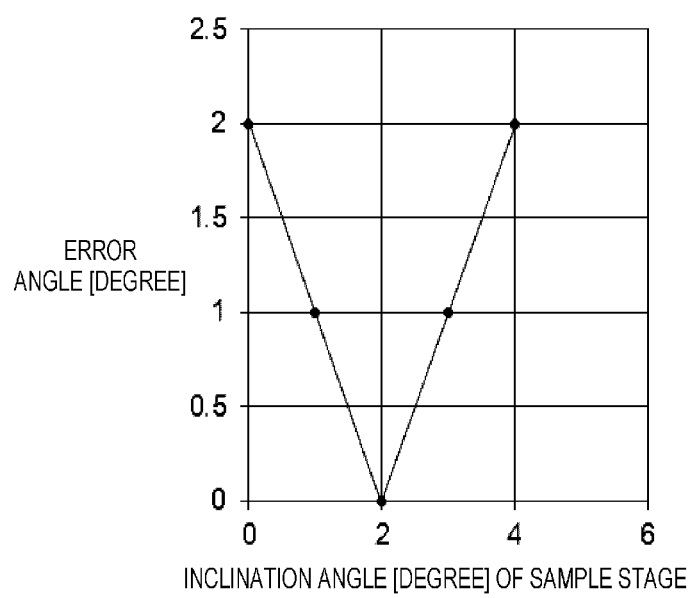

[FIG. 9]
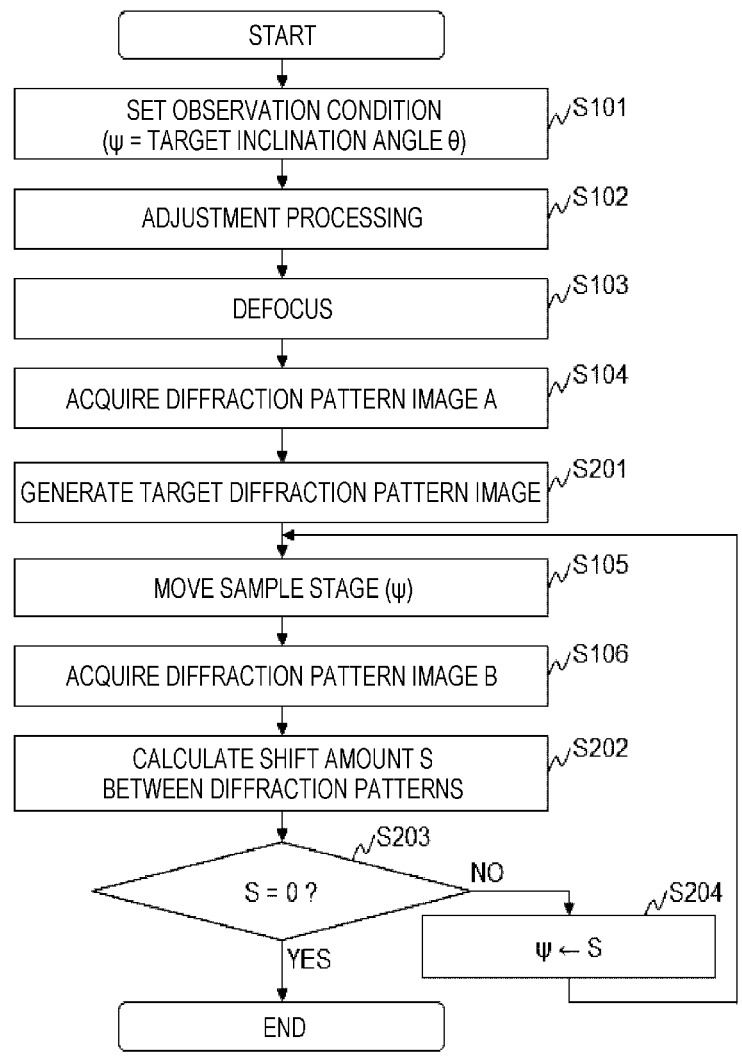

[FIG. 10A]
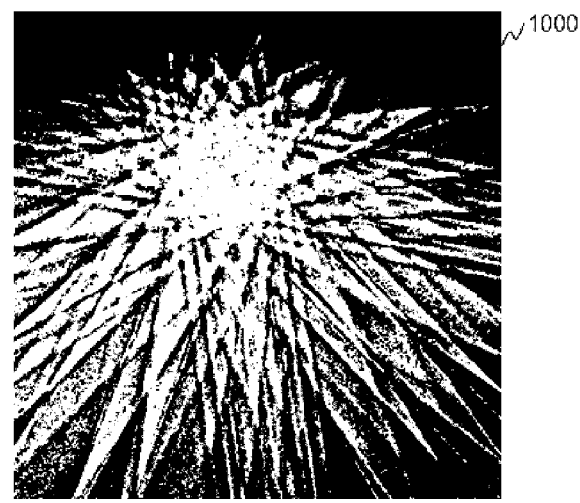
[FIG. 10B]
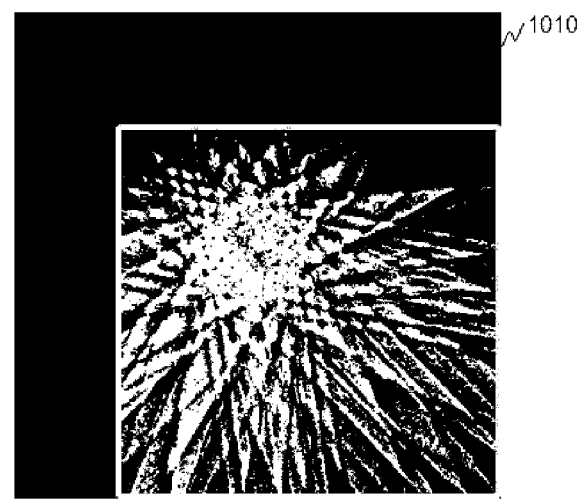

[FIG. 11]
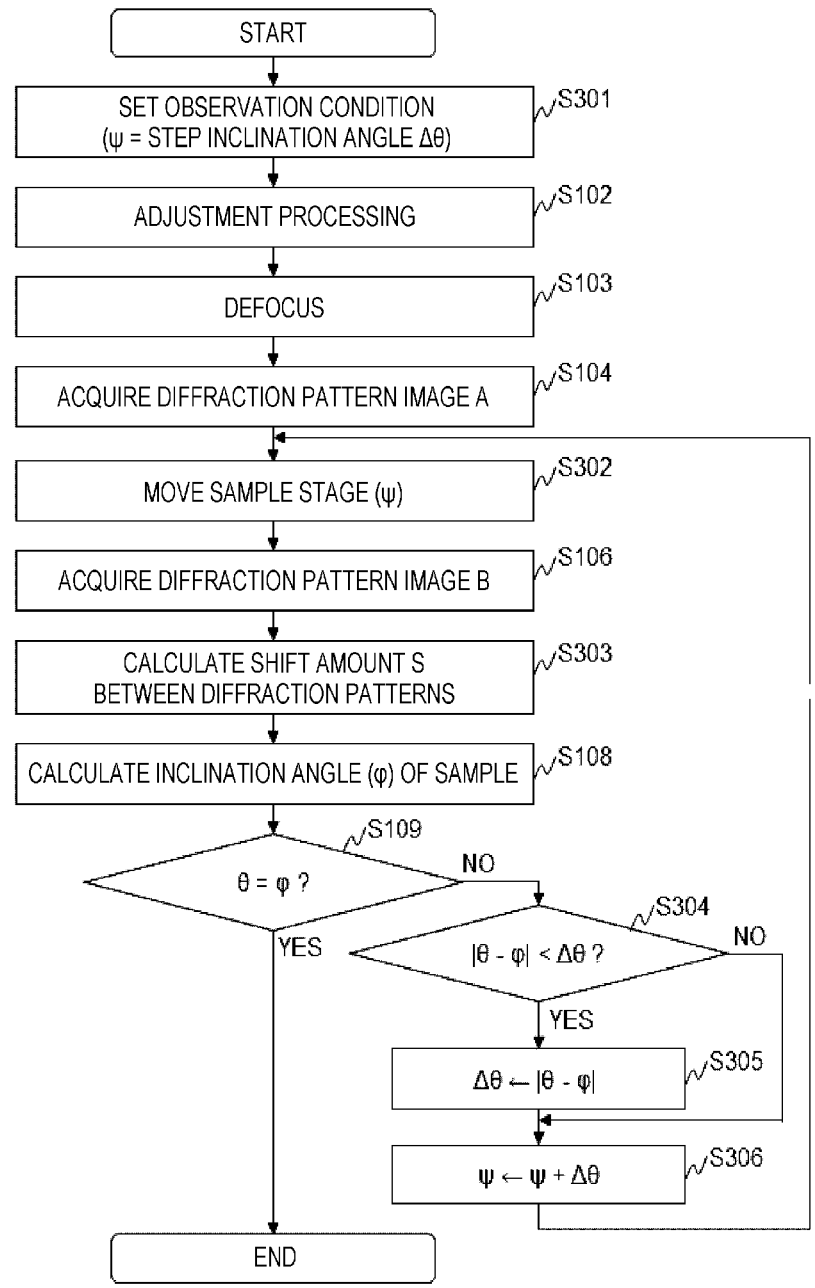

[FIG. 12]
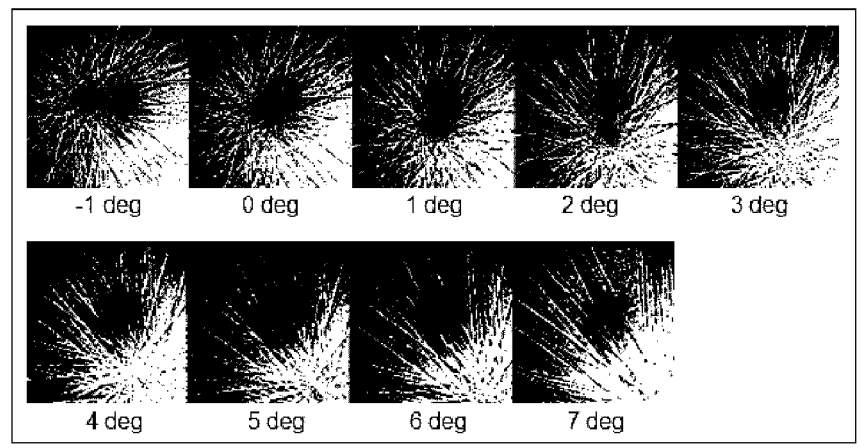
[FIG. 13]
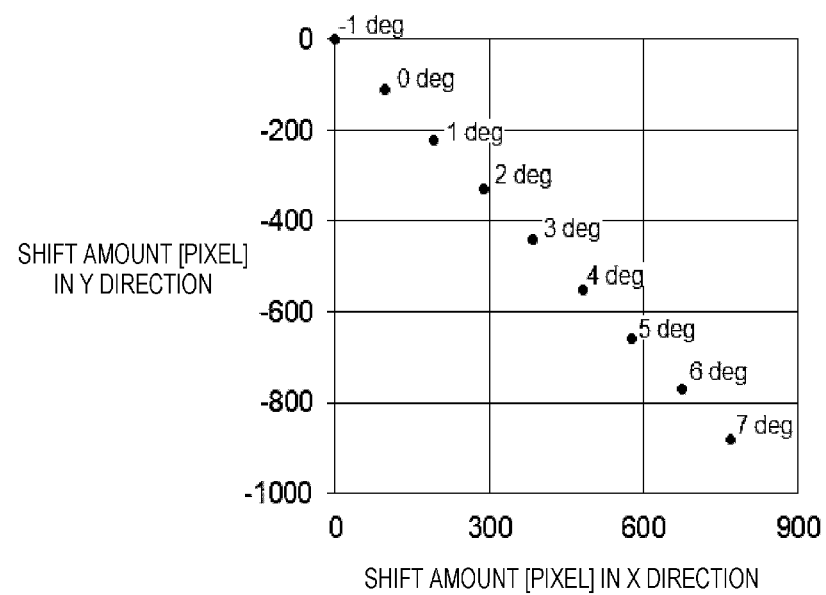

[FIG. 14]
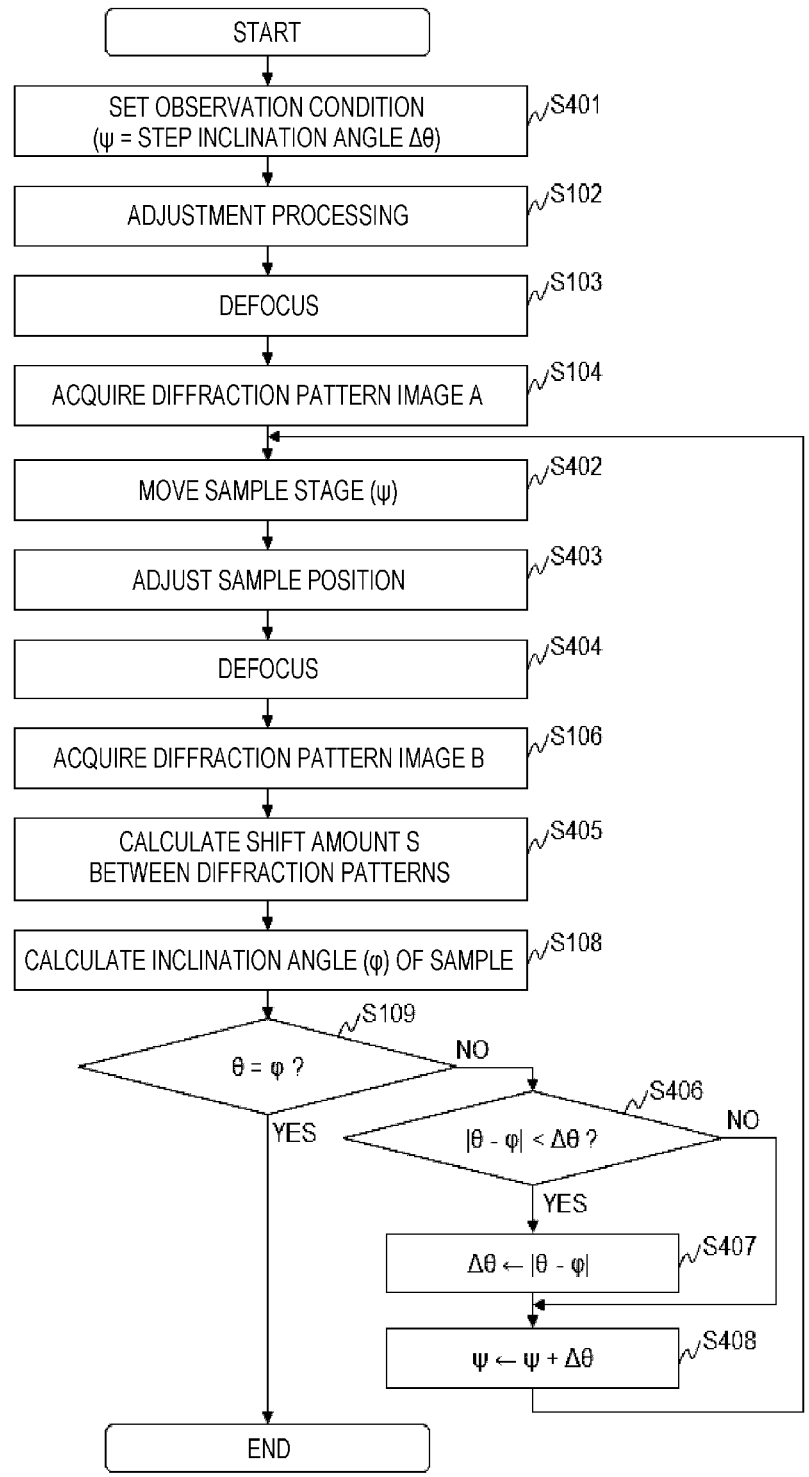

[FIG. 15]
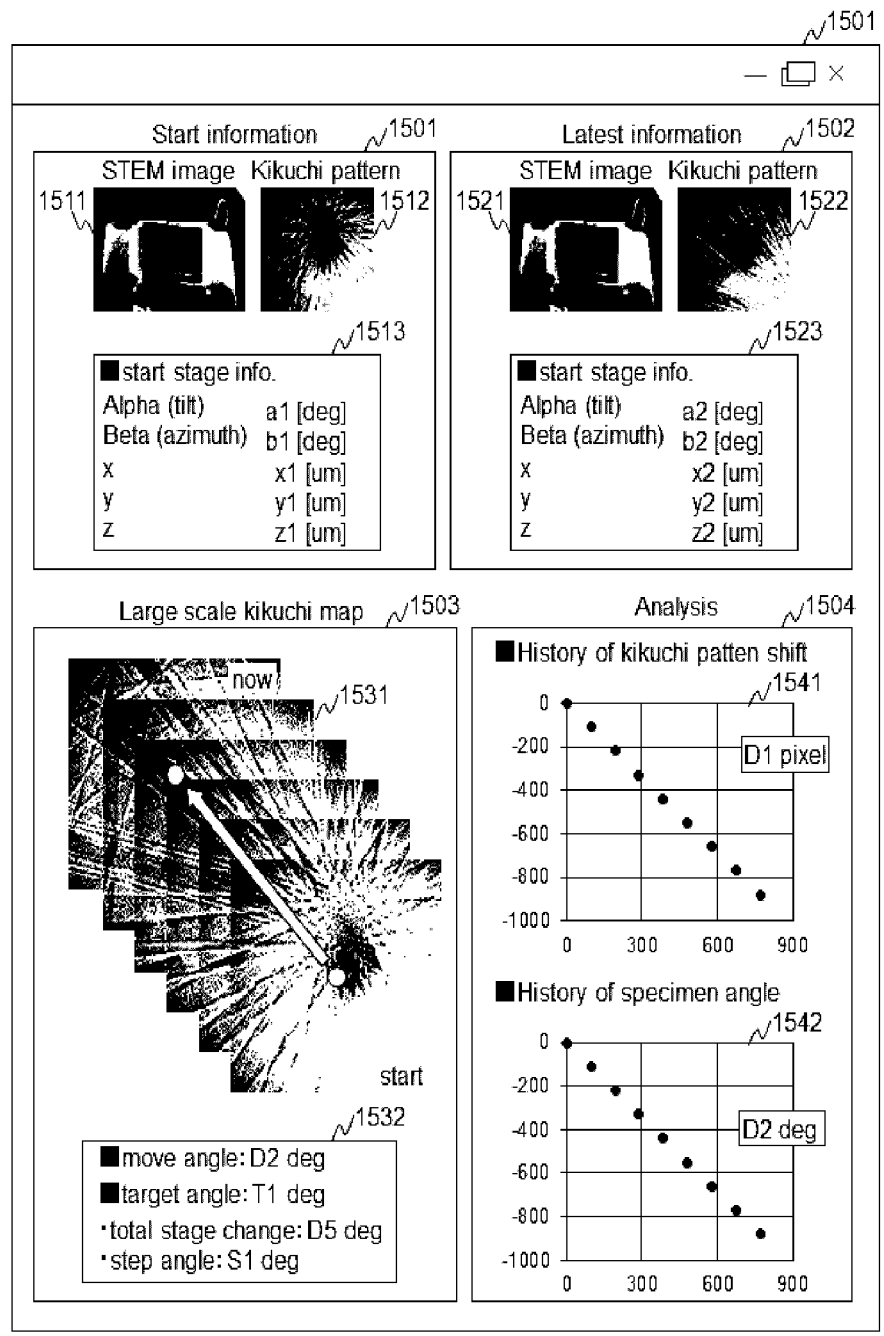

CHARGED PARTICLE BEAM APPARATUS AND METHOD FOR CONTROLLING CHARGED PARTICLE BEAM APPARATUS

TECHNICAL FIELD

The present invention relates to a charged particle beam apparatus and a method for controlling the charged particle beam apparatus.

BACKGROUND ART

In observing a sample using a charged particle beam apparatus such as a STEM/TEM, resolution of an obtained image changes depending on a crystal orientation of the sample to be irradiated with an electron beam. By arranging a sample structure in a traveling direction of an electron beam with which the sample is to be irradiated, a high-resolution image whose image bleeding is prevented can be obtained. The crystal orientation of the sample may be known based on an external appearance of the sample. However, in a case of a sample prepared by a focused ion beam apparatus or the like, the external appearance and an internal crystal direction are different from each other, and the crystal orientation of such a sample cannot be known based on the external appearance. When the crystal orientation of the sample cannot be determined based on the external appearance, it is necessary to calculate a deviation amount and a direction of the crystal orientation of the sample using a diffraction pattern obtained by performing irradiating with the electron beam.

As a method for calculating a crystal orientation of a sample, methods using a diffraction pattern as described in PTL 1 and PTL 2 are known.

PTL 1 describes a method of calculating a crystal orientation of a sample using a diffraction spot included in the diffraction pattern. Specifically, an observation method is disclosed that includes: "setting a fitting circular pattern (26) overlaid and displayed such that a main spot (23) is positioned on a circumference of the fitting circular pattern (26) on the basis of a diffraction spot brightness distribution in an electron beam diffraction pattern (22b) displayed on a display unit (13); setting a vector (28) displayed with a start point at a center position (27) of the displayed circular pattern (26) and an end point at a position of the main spot (23) positioned on the circumference of the circular pattern (26); and adjusting the crystal orientation on the basis of an orientation and a magnitude of the displayed vector (28)".

PTL 2 discloses "an inclination angle amount calculating device that is used in a charged particle beam apparatus configured to irradiate a surface of a sample mounted on a sample stage with a charged particle beam and that is configured to calculate inclination angle amounts, the inclination angle amount being command values for controlling an inclination direction and an inclination amount of the sample and/or the charged particle beam, the command values being necessary to change an incident direction of the charged particle beam with respect to the sample, the inclination angle amount calculating device including an inclination angle amount calculating unit configured to calculate the inclination angle amounts based on information that indicates the incident direction of the charged particle beam with respect to a crystal lying at a selected position on the surface in a state in which the incident direction of the charged particle beam with respect to the sample is a predetermined incident direction, the information being designated on a crystal orientation figure which is a diagram showing the incident direction of the charged particle beam with respect to a crystal coordinate system of the crystal".

CITATION LIST

Patent Literature

PTL 1: WO 2016/006375
PTL 2: WO 2018/221636

SUMMARY OF INVENTION

Technical Problem

In order to obtain an image with desired resolution, it is necessary to move a sample stage that fixes the sample according to the calculated crystal orientation of the sample. However, since the movement of the sample stage depends on adjustment accuracy of the sample stage, a deviation occurs between an ideal movement of the sample stage and an actual movement of the sample stage. In particular, the adjustment accuracy of an inclination angle of the sample stage is low.

Therefore, in general, the crystal orientation of the sample after the movement of the sample stage does not match a desired crystal orientation of the sample. Accordingly, when a crystal structure and the like of the sample is analyzed, in the related art, it is necessary for a user to compare an obtained image with a simulation result and check the obtained image and the simulation result.

The invention provides a charged particle beam apparatus capable of automatically and accurately adjusting a desired crystal orientation of a sample.

Solution to Problem

A representative example of the invention disclosed in the present application is as follows. That is, a charged particle beam apparatus is configured to emit a charged particle beam to observe a sample. The charged particle beam apparatus includes: a movement mechanism configured to hold and move a sample; a particle source configured to output the charged particle beam; an optical element configured to adjust an irradiation direction and a focal point of the charged particle beam with respect to the sample; a detector configured to detect charged particles emitted from the sample irradiated with the charged particle beam; and a control mechanism configured to control the movement mechanism, the particle source, the optical element, and the detector based on an observation condition. In the charged particle beam apparatus, the control mechanism is configured to acquire a diffraction pattern image including a plurality of Kikuchi lines as a comparison image after inclining the movement mechanism by a first angle, evaluate an error between an inclination angle of the sample and a target inclination angle using a reference image of a reference diffraction pattern and the comparison image, and control inclination of the movement mechanism based on an evaluation result.

Advantageous Effect

According to the invention, it is possible to provide a charged particle beam apparatus capable of automatically and accurately adjusting a desired crystal orientation of a sample. Problems, configurations, and effects other than those described above will be further clarified with the following description of embodiments.

BRIEF DESCRIPTION OF DRAWINGS

FIG. 1 is a diagram showing an example of a configuration of a transmission electron microscope (TEM) according to a first embodiment.

FIG. 2 is a flowchart illustrating sample stage adjustment processing executed by the TEM according to the first embodiment.

FIG. 3A is a diagram showing an example of a diffraction pattern image acquired by the TEM according to the first embodiment.

FIG. 3B is a diagram showing an example of the diffraction pattern image acquired by the TEM according to the first embodiment.

FIG. 3C is a diagram showing an example of the diffraction pattern image acquired by the TEM according to the first embodiment.

FIG. 4 is a graph showing relation between an inclination angle of a sample stage and a diffraction pattern shift amount according to the first embodiment.

FIG. 5 is a diagram showing geometric relation between the inclination angle of the sample stage and the diffraction pattern shift amount according to the first embodiment.

FIG. 6A is a graph showing relation between the inclination angle of the sample stage and an inclination angle of a sample according to the first embodiment.

FIG. 6B is a graph showing the relation between the inclination angle of the sample stage and the inclination angle of the sample according to the first embodiment.

FIG. 7 is a graph showing relation between an inclination angle of a sample stage and a correlation value between a target diffraction pattern and a diffraction pattern B according to a second embodiment.

FIG. 8 is a graph showing relation between the inclination angle of the sample stage and an error between an inclination angle φ of the sample and a target inclination angle θ according to the second embodiment.

FIG. 9 is a flowchart illustrating sample stage adjustment processing executed by a TEM according to the second embodiment.

FIG. 10A is a diagram showing an example of a diffraction pattern image acquired by the TEM according to the second embodiment.

FIG. 10B is a diagram showing an example of a target diffraction pattern image generated by the TEM according to the second embodiment.

FIG. 11 is a flowchart illustrating sample stage adjustment processing executed by a TEM according to a third embodiment.

FIG. 12 is a diagram showing an example of a series of diffraction pattern images acquired by the TEM according to the third embodiment.

FIG. 13 is a diagram showing relation between an inclination angle of a sample stage and a shift amount according to the third embodiment.

FIG. 14 is a flowchart illustrating sample stage adjustment processing executed by a TEM according to a fourth embodiment.

FIG. 15 is a diagram showing an example of a screen displayed by the TEM according to the fourth embodiment.

DESCRIPTION OF EMBODIMENTS

Embodiments of the invention will be described below with reference to drawings. However, the invention is not construed as being limited to the description of the embodiments described below. Those skilled in the art could have easily understood that specific configurations can be changed without departing from the spirit or scope of the invention.

In configurations of the invention described below, the same or similar configurations or functions are denoted by the same reference numerals, and a repeated description thereof is omitted.

In the present specification, expressions such as "first", "second", and "third" are used to identify components, and do not necessarily limit the number or order.

The positions, sizes, shapes, ranges, and the like of the components shown in the drawings and the like may not represent actual positions, sizes, shapes, ranges, and the like in order to facilitate understanding of the invention. Therefore, the invention is not limited to the positions, the sizes, the shapes, the ranges, and the like disclosed with reference to the drawings and the like.

First Embodiment

FIG. 1 is a diagram showing an example of a configuration of a transmission electron microscope (TEM) according to a first embodiment.

A TEM 100 includes an electron optical lens barrel 101 and a control unit 102.

The electron optical lens barrel 101 includes an electron source 111, first and second condenser lenses 112, a condenser aperture 113, an axis deviation correcting deflector 114, a stigmator 115, an image shift deflector 116, an objective lens 117, a sample stage 118, an intermediate lens 119, a projection lens 120, and a CCD camera 121. When the above-described devices provided in the electron optical lens barrel 101 are not distinguished from one another, the devices are also referred to as target devices.

The sample stage 118 holds a sample 122. The sample 122 may be held by a sample holder fixed to the sample stage 118. The sample stage 118, the sample holder, or a combination thereof is an example of a movement mechanism that holds and moves the sample 122.

Movement of the sample stage 118 includes an inclination movement, a shift movement, a rotational movement, and the like. The sample stage 118 can be inclined on one or a plurality of inclination axes (rotation axes).

An electron beam emitted from the electron source 111, which is a particle source, is reduced by the first and second condenser lenses 112, and has an emission angle limited by the condenser aperture 113. Further, the electron beam is emitted in a direction parallel to the sample 122 by a magnetic field in front of the objective lens 117 after an axis adjustment is performed by the axis deviation correcting deflector 114, the stigmator 115, and the image shift deflector 116.

The first and second condenser lenses 112, the condenser aperture 113, the axis deviation correcting deflector 114, the stigmator 115, the image shift deflector 116, the objective lens 117, the sample stage 118, the intermediate lens 119, and the projection lens 120 are examples of optical elements that adjust a direction and a focal point of the electron beam with respect to the sample 122.

Normally, in the TEM 100, a diffraction pattern is formed on a focal point plane on a rear side positioned between the objective lens 117 and the intermediate lens 119 due to an influence of a rear magnetic field of the objective lens 117.

The diffraction pattern is enlarged by the intermediate lens 119 and the projection lens 120, and is detected by the CCD camera 121.

The CCD camera 121 is an example of a detector that detects a signal emitted from the sample 122 irradiated with the electron beam.

A computer, which is the control unit 102, controls the electron optics lens barrel 101 using a plurality of control circuits. The control unit 102 includes an electron gun control circuit 151, an irradiation lens control circuit 152, a condenser aperture control circuit 153, an axis deviation correcting deflector control circuit 154, a stigmator control circuit 155, an image shift deflector control circuit 156, an objective lens control circuit 157, a sample stage control circuit 158, an intermediate lens control circuit 159, a projection lens control circuit 160, and a CCD camera control circuit 161.

The control unit 102 acquires a value of each target device via a respective one of the control circuits and inputs a value to each target device via a respective one of the control circuits to create an optional electron optical condition. The control unit 102 is an example of a control mechanism that controls the electron optical lens barrel 101.

As will be described later, the control unit 102 adjusts an inclination angle of the sample stage 118 using a diffraction pattern including a plurality of Kikuchi lines, instead of a diffraction pattern including a diffraction spot.

In general, in order to acquire the diffraction pattern including the diffraction spot, it is necessary to reduce an irradiation angle (also referred to as an opening angle) of a primary electron beam with which a sample is irradiated to approximately several mrad. This is because if the primary electron beam for irradiation is widened, the diffraction spot when acquired by a detector is also widened and overlaps with an adjacent spot, and thus it becomes difficult to separate spot positions.

When a method of implementing a thin primary electron beam using an irradiation aperture having a hole diameter of several micrometers is adopted, contamination due to irradiation with the electron beam is likely to be attached to the irradiation aperture, and a frequency of replacement of the irradiation aperture increases. In a case in which a method of implementing a thin primary electron beam by adjusting an intensity of an irradiation lens that controls the primary electron beam is adopted, an excitation condition changes when the intensity of the irradiation lens is changed. Therefore, it is necessary to perform a readjustment for an axis adjustment of an electron microscope. When a crystal orientation of a sample is adjusted under a condition different from an observation condition, it is possible that an accurate crystal orientation of the sample cannot be calculated.

On the other hand, when a diffraction pattern including a Kikuchi pattern is acquired, the irradiation angle of the primary electron beam can be larger than 30 mrad. Therefore, the electron beam is not limited as described above. The diffraction pattern including the Kikuchi pattern has a characteristic that the diffraction pattern has a continuous intensity distribution in a diffraction space.

The control unit 102 includes a processor 171, a main storage device 172, an auxiliary storage device 173, an input device 174, an output device 175, and a network interface 176. The devices are connected to one another via a bus.

The processor 171 executes a program stored in the main storage device 172. The processor 171 functions as various functional units by executing processing in accordance with the program.

The main storage device 172 is a storage device such as a semiconductor memory, and stores the program to be executed by the processor 171 and data. The main storage device 172 is also used as a work area temporarily used by a program. The main storage device 172 stores, for example, an operating system, a program for controlling the target device of the TEM 100, a program for acquiring an image of the sample 122, a program for processing the acquired image, or the like.

In the present specification, a case in which the processing is described mainly by the TEM 100 (control unit 102) means that the processor 171 that executes any one of the programs executes the processing.

The auxiliary storage device 173 is a storage device such as a hard disk drive (HDD) or a solid state drive (SSD), and permanently stores data. The program and the data that are stored in the main storage device 172 may be stored in the auxiliary storage device 173. In this case, the processor 171 reads out the program and the data from the auxiliary storage device 173 and loads the program and the data into the main storage device 172 when the control unit 102 is activated or the processing is necessary.

The input device 174 is a device such as a keyboard, a mouse, and a touch panel for a user to input instructions and information to the control unit 102. The output device 175 is a device such as a display and a printer that outputs an image, an analysis result, or the like to the user. The network interface 176 is an interface that executes communicating via a network.

In FIG. 1, the control unit 102 is described as one computer, but the control unit 102 may be implemented using a plurality of computers. A function of the control unit 102 may be implemented using a logic circuit.

The configuration and processing that are described in the first embodiment also can be applied to a charged particle beam apparatus other than the TEM 100. For example, the configuration and processing can be applied to a scanning transmission electron microscopy (STEM), a scanning electron microscopy (SEM) that detects secondary electrons and reflected electrons, and a device using charged particles different from electrons.

Unlike the TEM 100, the STEM irradiates the sample 122 with a focused electron beam, and scans the sample 122 with the focused electron beam using a deflection coil such as the image shift deflector 116. A transmission electron detector different from the CCD camera 121 is used to record a signal at each scanning position on the sample, and the control unit 102 displays an image.

FIG. 2 is a flowchart illustrating sample stage adjustment processing executed by the TEM 100 according to the first embodiment. FIGS. 3A, 3B, and 3C are diagrams showing an example of a diffraction pattern image acquired by the TEM 100 according to the first embodiment. FIG. 4 is a graph showing relation between the inclination angle of the sample stage 118 and a diffraction pattern shift amount according to the first embodiment. FIG. 5 is a diagram showing geometric relation between the inclination angle of the sample stage 118 and the diffraction pattern shift amount according to the first embodiment. FIGS. 6A and 6B are graphs showing relation between the inclination angle of the sample stage 118 and an inclination angle of the sample 122 according to the first embodiment.

In FIG. 2, processing for automatically adjusting the sample stage 118 such that the TEM 100 has a predetermined inclination angle (target inclination angle) of the sample 122 on one inclination axis will be described. It is assumed that the sample 122 is in a state of being present near a center of a field of view at a start of the processing.

The control unit 102 sets observation conditions such as an acceleration voltage and an irradiation current in the electron optics lens barrel 101 (step S101).

At this time, the control unit 102 sets, as the observation condition, a target inclination angle θ of the sample 122 for acquiring an image having desired resolution. Here, it is assumed that the target inclination angle θ is predetermined. The control unit 102 sets a target inclination angle to an inclination angle ψ which is a parameter for adjusting the inclination of the sample stage 118.

Next, the control unit 102 adjusts a contrast, a focus, and a position of the sample 122 such that an image of the sample 122 is clear (step S102). Specifically, the following processing is executed.

The control unit 102 adjusts, by transmitting a signal to the objective lens control circuit 157, a value of an objective lens current flowing through the objective lens 117 such that the image of the sample 122 is clear. By adjusting the focus, the value of the objective lens current flowing through the objective lens 117 changes from an objective lens current value IA (reference objective lens current value IA) that serves as a reference set in the electron optical lens barrel 101.

The control unit 102 obtains a height at which the image of the sample 122 is clear at the reference objective lens current value IA based on a difference between an objective lens current value IB and the reference objective lens current value IA. For example, when a sample height H0 before adjustment and a sample height H1 after adjustment are assumed, the sample height H1 after adjustment is obtained based on Equation (1). Here, A is a coefficient calculated based on relation between the objective lens current value and the sample height suitable for the focus, and a unit is "um/A".

[Formula 1]

$$H1=(IA-IB)\times A+H0 \quad (1)$$

By using the Equation (1), the sample height H1 can be calculated based on the difference between the objective lens current value IB after focus adjustment and the reference objective lens current value IA.

The control unit 102 adjusts a sample height of the sample stage 118 based on the sample height H1 via the sample stage control circuit 158. By adjusting the sample height, a clear image of the sample 122 can be observed at the reference objective lens current value IA of the TEM 100. The above is the description of the processing of step S102.

Next, the control unit 102 performs defocusing by adjusting the objective lens current value (step S103). The defocusing is an operation for acquiring an image (diffraction pattern) including a Kikuchi line. A defocus adjustment amount varies depending on conditions of the electron optical lens barrel 101 and an irradiation system. For example, an appropriate defocus adjustment amount at which the Kikuchi line is easily and clearly observed is approximately 5 um to 50 um, but the present patent can be applied even when the defocus adjustment amount is 50 um or more.

Specifically, the control unit 102 adjusts the objective lens current value based on the reference objective lens current value IA by the defocus adjustment amount using the coefficient A. The adjusted objective lens current amount IC is obtained based on Equation (2). Here, D represents a defocus amount.

[Formula 2]

$$IC=D\times A+IA \quad (2)$$

In general, there are two cases of the defocusing. One case of the defocusing has an intersection of electron beams on an electron gun side with respect to the sample 122 and the other case of the defocusing has an intersection on a lower side with respect to the sample 122. However, a defocusing method may be either.

In the first embodiment, the inclination angle of the sample 122 is calculated using the diffraction pattern including the Kikuchi line caused by multiple scattering.

There are various optical systems of the TEM 100 that record the Kikuchi line, and for example, a diffraction pattern obtained by irradiating the sample with an electron beam having a large opening angle (for example, approximately several hundred mrad) is used. Even when the opening angle of a primary beam with respect to the sample 122 is approximately 20 mrad, the same diffraction pattern may be acquired by adjusting parameters of image processing. At the above opening angle, an acceleration voltage of approximately 200 kV is assumed. However, when the acceleration voltage is low, a scattering angle changes according to a wavelength of the primary beam, and thus the opening angle of the primary beam required to obtain a similar diffraction pattern is small.

For example, as a guideline for the required opening angle, a parameter obtained by dividing an opening angle α by a wavelength λ may be adjusted to be constant. The guideline is obtained by approximating the Bragg's law, and more precisely, is a parameter obtained by dividing sin α by the wavelength λ. In a case of using the guideline as the parameter, a result is the same even when a reciprocal (wavelength λ is divided by the opening angle α) is used.

For example, in consideration of a fact that the wavelength is 2.5 pm when the opening angle is 200 mrad at the acceleration voltage of 200 kV, the opening angle is 384 mrad at 60 kV (wavelength of 4.8 pm) such that 200/2.5 [mrad/pm]=80 [mrad/pm] is constant. Similarly, when the opening angle of the primary beam at 200 kV with which the sample is irradiated is 30 mrad, the opening angle is 57.6 mrad.

Next, the control unit 102 acquires a diffraction pattern image A (reference image) including a plurality of Kikuchi lines (step S104). In the following description, a diffraction pattern projected in the acquired image A is also referred to as a diffraction pattern A.

Specifically, the control unit 102 acquires a diffraction pattern image by transmitting a recording signal to the CCD camera 121 via the CCD camera control circuit 161. For example, a diffraction pattern image 300 as shown in FIG. 3A is acquired. A straight line 301 included in the image 300 is the Kikuchi line. As described above, the diffraction pattern including a plurality of Kikuchi lines is projected in the image 300.

When acquiring the diffraction pattern image, the TEM 100 may emit an electron beam fixed at a specific position of the sample 122, or emit the electron beam so as to scan a partial region of the sample 122 by controlling the image shift deflector 116 or the like. By emitting the electron beam so as to scan the partial region of the sample 122, an effect of making the contrast and the like of the image clear can be expected.

The control unit 102 moves the sample stage 118 (step S105), and then acquires a diffraction pattern image B (comparison image) (step S106). In the following description, a diffraction pattern projected in the acquired image B is also referred to as a diffraction pattern B.

Specifically, the control unit 102 moves (rotates), based on the inclination angle ψ, the sample stage 118 by transmitting a signal to the sample stage control circuit 158. The control unit 102 acquires an image 310 in which the diffraction pattern as shown in FIG. 3B is projected after the sample stage 118 is moved.

Next, the control unit 102 calculates a diffraction pattern shift amount S using the diffraction pattern A and the diffraction pattern B (step S107).

Specifically, the control unit 102 compares the diffraction pattern A and the diffraction pattern B, and calculates the diffraction pattern shift amount based on a correlation value obtained based on a correlation function. For example, FIG. 4 is an example of a graph showing relation between an inclination angle and a shift amount when the sample stage 118 is inclined at 2 degrees. The shift amount is generally calculated as a movement pixel number at which the correlation value is maximum. However, the shift amount may be calculated as a change in a feature quantity by image matching or the like.

Since the diffraction pattern including the Kikuchi line has the characteristic of having a continuous intensity distribution in a diffraction space, the diffraction pattern shift amount can be calculated.

Next, the control unit 102 calculates an inclination angle φ of the sample 122 using the diffraction pattern shift amount S (step S108).

As shown in FIG. 5, the inclination angle φ of the sample 122 can be obtained based on a camera length L and the shift amount S according to Equation (3).

[Formula 3]

$$\tan \varphi = S/L \tag{3}$$

The camera length L can be calculated by analyzing the diffraction pattern or the like of the sample 122 having a known structure.

Next, the control unit 102 determines whether the inclination angle φ of the sample 122 coincides with the target inclination angle θ (step S109).

As shown in FIG. 6A, depending on an inclination accuracy of the sample stage 118, an error may occur between the inclination angle φ of the sample 122 and the target inclination angle θ. When an error occurs, the control unit 102 determines that the inclination of the sample stage 118 needs to be adjusted.

When the error between the inclination angle φ of the sample 122 and the target inclination angle θ is smaller than a threshold value, the control unit 102 may determine that the inclination angle φ of the sample 122 coincides with the target inclination angle θ.

When it is determined that the inclination angle φ of the sample 122 coincides with the target inclination angle θ, the control unit 102 ends the sample stage adjustment processing. After the end of the processing, the control unit 102 executes processing such as observation of the sample 122. When the sample 122 is observed, the observation conditions can be used without being changed.

When it is determined that the inclination angle φ of the sample 122 does not coincide with the target inclination angle θ, the control unit 102 sets, to anew inclination angle ψ, a value obtained by adding a difference between the target inclination angle θ and the inclination angle φ of the sample 122 to a current inclination angle ψ (step S110), and then returns to step S105. In this case, in step S106, an image 320 in which the diffraction pattern as shown in FIG. 3C is projected is acquired.

As shown in FIG. 6B, the control unit 102 can automatically adjust the inclination of the sample stage 118 such that the inclination angle φ of the sample 122 coincides with the target inclination angle θ.

When two inclination axes are present, the target inclination angle is set for each inclination axis. In this case, the control unit 102 calculates the inclination angle of the sample 122 with respect to each inclination axis based on a shift amount in a two-dimensional plane (xy plane), and adjusts the inclination of the sample stage 118 based on an error between the target inclination angle of each inclination axis and the inclination angle of the sample 122.

According to the first embodiment, the control unit 102 can automatically and accurately adjust the inclination of the sample stage 118 by executing analysis using the diffraction pattern including the Kikuchi line. Accordingly, the inclination of the sample 122, that is, the crystal orientation of the sample 122 can be automatically and accurately adjusted to a desired direction. In the first embodiment, the user does not need to refer to the diffraction pattern, and a crystal structure or the like of the sample may be unknown in advance.

Second Embodiment

In the second embodiment, the control unit 102 generates a target diffraction pattern image based on an image A of the diffraction pattern and the target inclination angle θ, and adjusts the inclination of the sample stage 118 based on a shift amount between a target diffraction pattern and the diffraction pattern B. Hereinafter, the second embodiment will be described focusing on differences from the first embodiment.

A configuration of the TEM 100 according to the second embodiment is the same as that according to the first embodiment. In the second embodiment, the sample stage adjustment processing is different.

FIG. 7 is a graph showing relation between the inclination angle of the sample stage 118 and a correlation value between the target diffraction pattern and the diffraction pattern B according to the second embodiment. FIG. 8 is a graph showing relation between an inclination angle of the sample stage 118 and an error between the inclination angle φ of the sample 122 and the target inclination angle θ according to the second embodiment.

When an angle at which the correlation value between the target diffraction pattern and the diffraction pattern B is maximum is set as the inclination angle of the sample stage 118 as shown in FIG. 7, the error between the inclination angle φ of the sample 122 and the target inclination angle θ is minimum as shown in FIG. 8. In the second embodiment, the above-described properties are used.

FIG. 9 is a flowchart illustrating sample stage adjustment processing executed by the TEM 100 according to the second embodiment. FIG. 10A is a diagram showing an example of a diffraction pattern image acquired by the TEM 100 according to the second embodiment. FIG. 10B is a diagram showing an example of a target diffraction pattern image generated by the TEM 100 according to the second embodiment.

Processing from step S101 to step S104 are the same as the processing according to the first embodiment. However, in the second embodiment, the image A of the diffraction pattern is acquired as a processing image. After the processing in step S104 is executed, the control unit 102 generates the target diffraction pattern image (reference image) based on the image of the diffraction pattern A and the target inclination angle θ (step S201).

For example, a target diffraction pattern image 1010 as shown in FIG. 10B is generated based on a diffraction pattern image 1000 as shown in FIG. 10A.

Processing in step S105 and step S106 are the same as the processing according to the first embodiment. After the processing in step S106 is executed, the control unit 102 calculates the diffraction pattern shift amount S using the target diffraction pattern and the diffraction pattern B (step S202). A method for calculating the shift amount S is the same as that according to the first embodiment.

Next, the control unit 102 determines whether the diffraction pattern shift amount S is 0 (step S203). That is, whether the error between the inclination angle φ of the sample 122 and the target inclination angle θ is minimum is determined.

When it is determined that the diffraction pattern shift amount S is 0, the control unit 102 ends the sample stage adjustment processing.

When it is determined that the diffraction pattern shift amount S is not 0, the control unit 102 sets the shift amount S to a new inclination angle ψ (step S204), and then returns to step S105.

According to the second embodiment, similar to the first embodiment, the control unit 102 can automatically and accurately adjust the crystal orientation of the sample 122 to a desired direction by executing the analysis using the diffraction pattern including the Kikuchi line. In the second embodiment, since it is not necessary to calculate the inclination angle of the sample 122, processing cost can be reduced and a processing speed can be increased.

Third Embodiment

When the target inclination angle θ is large, the diffraction pattern shift amount also increases with the movement of the sample stage 118. Therefore, there may be no correlation between the diffraction pattern before movement and the diffraction pattern after movement. In this case, the diffraction pattern shift amount cannot be calculated even the two diffraction patterns are compared. In a third embodiment, even when the target inclination angle θ is large, the inclination of the sample stage 118 can be adjusted automatically and accurately. Hereinafter, the third embodiment will be described focusing on differences from the first embodiment.

A configuration of the TEM 100 according to the third embodiment is the same as that according to the first embodiment. In the third embodiment, the sample stage adjustment processing is different.

FIG. 11 is a flowchart illustrating sample stage adjustment processing executed by the TEM 100 according to the third embodiment. FIG. 12 is a diagram showing an example of a series of diffraction pattern images acquired by the TEM 100 according to the third embodiment. FIG. 13 is a diagram showing relation between an inclination angle of the sample stage 118 and a shift amount according to the third embodiment.

First, the control unit 102 sets observation conditions such as an acceleration voltage and an irradiation current in the electron optics lens barrel 101 (step S301).

In step S301, the step inclination angle Δθ is set to the inclination angle ψ. Other processing is the same as that in step S101. The step inclination angle Δθ is smaller than the target inclination angle and is set in advance as a default value. The step inclination angle Δθ can be updated as described later.

Processing from step S102 to step S104 are the same as the processing according to the first embodiment. After the processing in step S104 is executed, the control unit 102 moves the sample stage 118 (step S302), and then acquires the diffraction pattern image B (step S106).

Specifically, the control unit 102 moves, based on the inclination angle ψ, the sample stage 118 by transmitting a signal to the sample stage control circuit 158. The processing in step S106 is the same as that according to the first embodiment. However, the control unit 102 stores the acquired image B of the diffraction pattern in the main storage device 172. Therefore, the main storage device 172 stores the series of images B of the diffraction pattern as shown in FIG. 12.

Next, the control unit 102 calculates the diffraction pattern shift amount S using the diffraction pattern A and the series of diffraction patterns B (step S303).

Specifically, the control unit 102 generates a pair of diffraction patterns obtained before and after the adjustment of the sample stage 118 based on the inclination angle ψ, and calculates the shift amount of the pair of the diffraction patterns. A method for calculating the diffraction pattern shift amount is the same as that according to the first embodiment. The control unit 102 calculates a total value of the shift amount of each pair of diffraction patterns as the diffraction pattern shift amount S.

As shown in FIG. 13, the control unit 102 may store a processing result of step S303 in the main storage device 172. FIG. 13 shows a shift amount on a two-dimensional plane. In this case, the shift amount of the pair of diffraction patterns is given as a square-root of a sum of a square of the shift amount in an x direction and a square of the shift amount in a y direction.

When the processing result of step S303 is stored in the main storage device 172, the control unit 102 calculates, as a new diffraction pattern shift amount S, a value obtained by adding a previous diffraction pattern shift amount S to a shift amount between a latest diffraction pattern B and a previous diffraction pattern B.

Processing in step S108 and step S109 are the same as that according to the first embodiment. When it is determined in step S109 that the inclination angle φ of the sample 122 does not coincide with the target inclination angle θ, the control unit 102 determines whether an absolute value of the difference between the target inclination angle θ and the inclination angle φ of the sample 122 is smaller than the step inclination angle Δθ (step S304).

When it is determined that the absolute value of the difference between the target inclination angle θ and the inclination angle φ of the sample 122 is greater than or equal to the step inclination angle Δθ, the control unit 102 proceeds to step S306.

When it is determined that the absolute value of the difference between the target inclination angle θ and the inclination angle φ of the sample 122 is smaller than the step inclination angle Δθ, the control unit 102 sets the absolute value of the difference between the target inclination angle θ and the inclination angle φ of the sample 122 as a new step inclination angle Δθ (step S305), and then proceeds to step S306.

In step S306, the control unit 102 sets, to a new inclination angle ψ, a value obtained by adding the step inclination angle Δθ to a current inclination angle ψ (step S306), and then returns to step S302.

The control unit 102 can calculate the diffraction pattern shift amount S when the sample stage 118 is largely inclined by gradually changing the inclination of the sample stage 118. By updating the step inclination angle Δθ in accordance with the error between the target inclination angle θ and the inclination angle φ of the sample 122, it is possible to improve the adjustment accuracy of the inclination of the sample stage 118.

According to the third embodiment, even when the target inclination angle θ is large, the crystal orientation of the sample 122 can be automatically and accurately adjusted in a desired direction.

Fourth Embodiment

In a fourth embodiment, the control unit 102 adjusts setting of the TEM 100 such that a clear diffraction pattern can be acquired after the sample stage 118 is moved. Hereinafter, the fourth embodiment will be described focusing on differences from the first embodiment.

A configuration of the TEM 100 according to the fourth embodiment is the same as that according to the first embodiment. In the fourth embodiment, the sample stage adjustment processing is different.

FIG. 14 is a flowchart illustrating sample stage adjustment processing executed by the TEM 100 according to the fourth embodiment.

First, the control unit 102 sets observation conditions such as an acceleration voltage and an irradiation current in the electron optical lens barrel 101 (step S401).

In step S401, the step inclination angle Δθ is set to the inclination angle ψ. Other processing is the same as that in step S101. The step inclination angle Δθ is smaller than the target inclination angle and is set in advance as a default value. The step inclination angle Δθ can be updated as described later.

Processing from step S102 to step S104 are the same as the processing according to the first embodiment. After the processing in step S104 is executed, the control unit 102 moves the sample stage 118 (step S402), and then adjusts and defocuses a sample position (step S403 and step S404). Thereafter, the control unit 102 acquires the diffraction pattern image B (step S106).

In step S402, the control unit 102 moves, based on the inclination angle ψ, the sample stage 118 by transmitting a signal to the sample stage control circuit 158. In step S403, the control unit 102 moves the sample stage 118 so as to correct a deviation of a height of the sample 122 in accordance with the inclination of the sample stage 118. Step S404 is the same processing as step S103. In step S106, the control unit 102 temporarily stores an image of the diffraction pattern B in the main storage device 172. The main storage device 172 stores a series of images of B the diffraction pattern.

Next, the control unit 102 calculates the diffraction pattern shift amount S using the diffraction pattern A and the series of diffraction patterns B (step S405).

Specifically, the control unit 102 generates a pair of diffraction patterns obtained before and after the adjustment of the sample stage 118 based on the inclination angle ψ, and calculates the shift amount of the pair of the diffraction patterns. A method for calculating the diffraction pattern shift amount is the same as that according to the first embodiment. The control unit 102 calculates a total value of the shift amount of each pair of diffraction patterns as the diffraction pattern shift amount S.

The control unit 102 may store a processing result of step S405 in the main storage device 172. In this case, the control unit 102 calculates, as a new diffraction pattern shift amount S, a value obtained by adding a previous diffraction pattern shift amount S to a shift amount between a latest diffraction pattern B and a previous diffraction pattern B.

Processing in step S108 and step S109 are the same as that according to the first embodiment. When it is determined in step S109 that the inclination angle φ of the sample 122 does not coincide with the target inclination angle θ, the control unit 102 determines whether an absolute value of the difference between the target inclination angle θ and the inclination angle φ of the sample 122 is smaller than the step inclination angle Δθ (step S406).

When it is determined that the absolute value of the difference between the target inclination angle θ and the inclination angle φ of the sample 122 is greater than or equal to the step inclination angle Δθ, the control unit 102 proceeds to step S408.

When it is determined that the absolute value of the difference between the target inclination angle θ and the inclination angle φ of the sample 122 is smaller than the step inclination angle Δθ, the control unit 102 sets the absolute value of the difference between the target inclination angle θ and the inclination angle φ of the sample 122 as a new step inclination angle Δθ (step S407), and then proceeds to step S408.

In step S408, the control unit 102 sets, to a new inclination angle ψ, a value obtained by adding the step inclination angle Δθ to a current inclination angle ψ (step S408), and then returns to step S402.

The control unit 102 can calculate the diffraction pattern shift amount S when the sample stage 118 is largely inclined by gradually changing the inclination of the sample stage 118. By updating the step inclination angle Δθ in accordance with the error between the target inclination angle θ and the inclination angle φ of the sample 122, it is possible to improve the adjustment accuracy of the inclination of the sample stage 118. The control unit 102 can acquire a clear diffraction pattern by moving the sample stage 118, then adjusting a position of the sample stage 118, and performing defocusing again.

After the processing in step S102 and after the processing in step S402, the control unit 102 may acquire an image of the sample 122.

FIG. 15 is a diagram showing an example of a screen 1500 displayed by the TEM 100 according to the fourth embodiment.

The screen 1500 includes four display fields 1501, 1502, 1503, and 1504.

The display field 1501 is a field that displays information such as a state of the TEM 100 before the start of the sample stage adjustment processing. The display field 1501 includes an image 1511 of the sample 122, a diffraction pattern image 1512, and a parameter field 1513 that indicates a state of the sample stage 118.

The display field 1502 is a field that displays information such as a state of the TEM 100 after the end of the sample stage adjustment processing. The display field 1502 includes an image 1521 of the sample 122, a diffraction pattern image 1522, and a parameter field 1523 that indicates a state of the sample stage 118.

The display field 1503 is a field that displays information related to the diffraction pattern used at the time of calculating the shift amount S. The display field 1503 includes a map image 1531 generated based on the series of diffraction patterns used at the time of calculating the shift amount, and a calculation value field 1532 that displays the shift amount, the inclination angle of the sample stage 118, and the like.

The display field 1504 is a field that displays histories of the shift amount S and the inclination angle φ of the sample 122. The display field 1504 includes a graph 1541 that displays the history of the shift amount S and a graph 1542 that displays the history of the inclination angle φ of the sample 122.

A user can check an adjustment result of the sample stage 118 and the image of the sample 122 by referring to the screen 1500.

According to the fourth embodiment, even when the target inclination angle is large, the crystal orientation of the sample 122 can be automatically and accurately adjusted in a desired direction. By adjusting the setting of the TEM 100 after the movement of the sample stage 118, a clear diffraction pattern can be acquired.

The invention is not limited to the above-mentioned embodiments, and includes various modifications. For example, the embodiments described above have been described in detail for easy understanding of the invention, and the invention is not necessarily limited to those including all the configurations described above. A part of the configuration according to the embodiment may be deleted and may be added and replaced with another configuration.

Each of the configurations, functions, processing units, processing methods or the like described above may be implemented by hardware by designing a part or all of the configurations, functions, processing units, processing methods or the like with, for example, an integrated circuit. The invention can also be implemented by a program code of software that implements the functions according to the embodiment. In this case, a storage medium recording the program code is provided to a computer, and a processor provided in the computer reads out the program code stored in the storage medium. In this case, the program code itself readout from the storage medium implements the functions according to the above-described embodiment, and the program code itself and the storage medium storing the program code constitute the invention. As a storage medium that supplies such a program code, for example, a flexible disk, a CD-ROM, a DVD-ROM, a hard disk, a solid state drive (SSD), an optical disk, a magneto-optical disk, a CD-R, a magnetic tape, a nonvolatile memory card, or a ROM is used.

The program code that implements the functions described in the present embodiment can be implemented in a wide range of programs or script languages such as assembler, C/C++, perl, Shell, PHP, Python, and Java.

Further, the program code of the software that implements the function according to the embodiments may be stored in a storage device such as a hard disk or a memory of a computer or a storage medium such as a CD-RW or a CD-R by delivering the program code via a network, and a processor provided in the computer may read out and execute the program code stored in the storage device or the storage medium.

In the embodiments described above, control lines and information lines are considered to be necessary for description, and all control lines and information lines are not necessarily shown in the product. All configurations may be connected to one another.

The invention claimed is:

1. A method for controlling a charged particle beam apparatus configured to emit a charged particle beam to observe a sample,
the method comprising:
a first step of acquiring, a diffraction pattern image including a plurality of Kikuchi lines as a comparison image after inclining the sample by a first angle;
a second step of evaluating, an error between an inclination angle of the sample and a target inclination angle based on a two-dimensional image correlation determination of a shift amount in pixels between a diffraction pattern reference image as a reference and the comparison image; and
a third step of controlling, inclination of the sample based on an evaluation result of the second step, wherein the inclination angle of the sample is calculated based on the shift amount and a predetermined camera length for the charged particle beam apparatus.

2. The method for controlling a charged particle beam apparatus according to claim 1, wherein
the third step includes a step of updating, when it is determined that the error between the inclination angle of the sample and the target inclination angle occurs, the first angle based on at least one of this error and a default value, and
the first step includes a step of acquiring, the diffraction pattern image as the comparison image after inclining the sample by the updated first angle.

3. The method for controlling a charged particle beam apparatus according to claim 2, wherein
the second step includes:
a fourth step of calculating, a diffraction pattern shift amount, which is a movement amount between the diffraction patterns each included in a respective one of the reference image and the comparison image, using the reference image and the comparison image; and
a fifth step of calculating, the inclination angle of the sample based on a distance between a detector and the sample and the diffraction pattern shift amount.

4. The method for controlling a charged particle beam apparatus according to claim 3, wherein
the first step further includes a step of storing, the comparison image as a history, and
the fourth step includes a step of calculating, as the diffraction pattern shift amount, a movement amount between the diffraction patterns each included in a respective one of the reference image and the latest comparison image using the reference image and the history of the comparison image.

5. The method for controlling a charged particle beam apparatus according to claim 1, the method further comprising
a step of setting, as the reference image, the diffraction pattern image acquired by irradiating the sample with the charged particle beam, the sample being inclined at an angle different from the first angle.

6. The method for controlling a charged particle beam apparatus according to claim 1, the method further comprising:
a step of irradiating, with a charged particle beam, the sample inclined at an angle different from the first angle to acquire the diffraction pattern image as a processing image; and
a step of generating, an image in which a diffraction pattern included in the processing image is shifted in any direction based on the processing image and the target inclination angle to set this image as the reference image, wherein the second step includes a step of calculating, using the reference image and the comparison image, as a value for evaluating an error between the inclination angle of the sample and the target inclination angle, a diffraction pattern shift amount which is a movement amount between the diffraction patterns each included in a respective one of the reference image and the comparison image, and the second step includes a step of adjusting, the inclination of the sample based on the diffraction pattern shift amount.

7. The method for controlling a charged particle beam apparatus according to claim 1, wherein the first angle is smaller than the target inclination angle.

* * * * *